United States Patent
Dawson et al.

[11] Patent Number: 5,998,293
[45] Date of Patent: Dec. 7, 1999

[54] MULTILEVEL INTERCONNECT STRUCTURE OF AN INTEGRATED CIRCUIT HAVING AIR GAPS AND PILLARS SEPARATING LEVELS OF INTERCONNECT

[75] Inventors: Robert Dawson, Austin; Mark W. Michael, Cedar Park; William S. Brennan, Austin; Basab Bandyopadhyay, Austin; H. Jim Fulford, Jr., Austin; Fred N. Hause, Austin, all of Tex.

[73] Assignee: Advanced Micro Devcies, Inc.

[21] Appl. No.: 09/067,425

[22] Filed: Apr. 28, 1998

Related U.S. Application Data

[62] Division of application No. 08/655,248, Jun. 5, 1996, Pat. No. 5,783,864.

[51] Int. Cl.[6] .................................................. H01L 21/283
[52] U.S. Cl. ........................................... 438/619; 438/622
[58] Field of Search .................................... 438/619, 622, 438/637, 672, FOR 355

[56] References Cited

U.S. PATENT DOCUMENTS

| | | | |
|---|---|---|---|
| 4,681,655 | 7/1987 | Potter | 156/632 |
| 4,899,439 | 2/1990 | Potter et al. | 29/846 |
| 4,920,639 | 5/1990 | Yee | 29/846 |
| 5,000,818 | 3/1991 | Thomas et al. | 156/643 |
| 5,117,276 | 5/1992 | Thomas et al. | 257/522 |
| 5,141,896 | 8/1992 | Katoh | 437/195 |
| 5,386,142 | 1/1995 | Kurtz et al. | 257/508 |
| 5,413,962 | 5/1995 | Lur et al. | 437/195 |
| 5,567,982 | 10/1996 | Bartelink | 257/664 |

FOREIGN PATENT DOCUMENTS

| | | | |
|---|---|---|---|
| 401262646 | 10/1989 | Japan | 438/FOR 355 |
| 5-335475 | 12/1993 | Japan | 257/664 |

*Primary Examiner*—Charles Bowers
*Assistant Examiner*—Matthaw Whipple
*Attorney, Agent, or Firm*—Kevin L. Daffer; Conley, Rose & Tayon

[57] ABSTRACT

An improved multilevel interconnect structure is provided. The interconnect structure includes pillars spaced from each other across a wafer. The pillars are placed between levels of interconnect or between an interconnect level and a semiconductor substrate. The pillars are spaced from each other by an air gap, such that each conductor within a level of interconnect is spaced by air from one another. Furthermore, each conductor within one level of interconnect is spaced by air from each conductor within another level of interconnect. Air gaps afford a smaller interlevel and intralevel capacitance within the multilevel interconnect structure, and a smaller parasitic capacitance value affords minimal propagation delay and cross-coupling noise of signals sent through the conductors. The air gaps are formed by dissolving a sacrificial dielectric, and the conductors are prevented from bending or warping in regions removed of sacrificial dielectric by employing anodization on not just the upper surfaces of each conductor, but the sidewalls as well. The upper and sidewall anodization provides a more rigid metal conductor structure than if merely the upper or sidewall surfaces were anodized. Accordingly, the pillars can be spaced further apart and yet provide all necessary support to the overlying conductors.

11 Claims, 4 Drawing Sheets

MULTILEVEL INTERCONNECT STRUCTURE OF AN INTEGRATED CIRCUIT HAVING AIR GAPS AND PILLARS SEPARATING LEVELS OF INTERCONNECT

This is a Division of application Ser. No. 08/655,248, filed Jun. 5, 1996, now U.S. Pat. No. 5,783,864.

BACKGROUND OF THE INVENTION

1. Field of the Invention

This invention relates to semiconductor fabrication and more particularly to an integrated circuit which employs a multilevel interconnect structure having a layer of air which separates conductors within each level of interconnect and conductors between levels of interconnect. Pillars are spaced within the layer of air to support conductors within each interconnect level. The conductors are made rigid using a layer of anodized aluminum formed on each conductor. Conductors on dissimilar levels are electrically connected by contacts arranged within select pillars.

2. Description of the Relevant Art

Fabrication of an integrated circuit involves placing numerous devices on a single monolithic substrate. Each device is electrically isolated from the others, but later in the fabrication sequence specific devices are electrically interconnected so as to implement desired circuit function. Interconnect of those devices often takes place on more than one elevational level, each level having a set of substantially coplanar interconnect conductors. Numerous levels of interconnect arranged above a monolithic substrate is generally referred to as a multilevel interconnect structure.

A level of interconnect is made simultaneously using lithography techniques from electrically conductive material, a suitable material includes Al, Ti, Ta, W, Mo, Cu, polysilicon, or a combination thereof. The multilevel interconnect structure is deposited layer-by-layer upon a semiconductor substrate, a suitable substrate includes any type of material which can retain dopant ions and the isolated conductivity regions brought about by those ions. Typically, a substrate is a silicon-based material which receives P-type or N-type ions.

Generally speaking, each conductor within a level of conductors is dielectrically spaced from one another by a relatively small distance. That spacing to some extent determines interlevel capacitance between conductors on dissimilar levels and intralevel capacitance between conductors on the same level. Thus, a multilevel interconnect structure comprises conductors which are horizontally and vertically spaced from each other across a semiconductor topography. Dielectric constant of dielectric material arranged horizontally and vertically between conductors also determines intralevel and interlevel capacitance, and interlevel and intralevel capacitance determine, to some extent, the electrical performance of a signal forwarded through a conductor. For example, large intralevel and interlevel capacitance not only causes noise cross-coupling between conductors, but also increases the propagation delay of a signal forwarded through the conductors.

Modern integrated circuits generally employ close conductor spacing which cause unacceptably large propagation delays and cross-talk noise within the conductors. Even if a conductor does not transition, it nonetheless receives cross-talk noise from neighboring, closely spaced conductors which do. It is thereby important to minimize propagation delay and cross-talk noise problems by paying close attention to the dielectric properties of dielectrics which are horizontally or vertically spaced between conductors. The primary dielectric property of concern is the dielectric constant. By lowering the dielectric constant, problems of propagation delay and cross-coupling can be reduced even when conductor spacings are fairly small.

It would therefore be desirable to employ a dielectric which reduces the intralevel and interlevel capacitance, and thereby reduces propagation delay and cross-coupling noise. A dielectric of lowest possible dielectric constant affords closer spacing between conductors on separate levels or within the same level.

SUMMARY OF THE INVENTION

The problems outlined above are in large part solved by a multilevel interconnect structure. The interconnect structure comprises a dielectric of air residing between conductors on the same level and between conductors on dissimilar levels. The air dielectric provides the lowest possible dielectric constant. The dielectric constant of air is approximately 1.0, depending on humidity and temperature conditions. A typical oxide dielectric constant is approximately between 3.8 and 4.3. What are known as "low K" dielectrics still have a constant which exceeds 2.0.

Producing an air dielectric within a layer of interconnect (intralevel dielectric) and an air dielectric between layers of interconnect (interlevel dielectric) poses many problems. Since air does not provide support, the interconnect material must be fairly rigid and, to some extent, must support itself for at least a substantial portion of its run. The interconnect must not flex or deform upon lower-residing conductors or horizontally spaced conductors. Forming a rigid conductor is achieved by forming an oxide on the upper surface as well as sidewall surfaces of aluminum conductors. The U-shaped coating prevents horizontal and vertical deformation of the conductor during either conductor fabrication or operation. The rigid oxide coating is produced by anodization.

The oxide coating on the conductor upper and sidewall surfaces not only rigidizes conductors within the multilevel interconnect structure, but also serves other important functions. First, the oxide coating helps reduce ingress of corrosive material into the aluminum arranged beneath the oxide coating. Second, the oxide coating helps reduce hillock formation or the upper surface of the aluminum conductor. The oxide also reduces compressive stress which occurs during vacancy migration along aluminum grain structures. Reduction in corrosivity, hillock formation and compressive stress enhances the durability and reliability of interconnect conductors thusly coated.

According to one embodiment of the present invention, air gaps of low dielectric constant are formed by presenting dielectric pillars in select regions across and between levels of interconnect. The pillars serve to separate at regular intervals one level of conductors from another level of conductors. The pillars exist a maximum spaced distance apart, e.g., no greater than 50 microns apart. Conductors which reside upon the pillars maintain their separation from underlying conductors due to their rigidity brought about by anodization.

According to another embodiment of the present invention, contacts are formed within select pillars. The contacts extend entirely within the sidewalls of the pillars and extend from a lower level conductor to an upper level conductor. Accordingly, conductors within a level are separated from each other by an air gap, and conductors in separate levels are spaced by an air gap except for select contacts areas within pillars. The pillars are made from a dielectric material, a suitable material being silicon dioxide or silicon nitride. Other suitable materials include spin on polymers (i.e., polyimide) or methyl silsesquioxane.

Broadly speaking, the present invention contemplates a multilevel interconnect structure. The interconnect structure comprises a first layer of dielectric pillars spaced by air from each other across a semiconductor topography. A first layer of substantially coplanar conductors are spaced by air from each other across the first layer of dielectric pillars. A first contact is configured within a select one of the dielectric pillars, wherein the contact extends perpendicular to the semiconductor topography from the semiconductor topography to one conductor within the first layer of conductors.

According to one embodiment, the multilevel interconnect structure further includes a second layer of dielectric pillars spaced by air from each other across the first layer of conductors. The second layer of substantially coplanar conductors are spaced by air from each other across the second layer of dielectric pillars. A second contact is configured within a select one of the second layer of dielectric pillars, wherein the second contact extends perpendicular to the semiconductor topography from one conductor within the first layer of conductors to one conductor within the second layer of conductors.

The present invention further contemplates a method for forming a multilevel interconnect structure. The method includes patterning a plurality of coplanar first pillars a spaced distance from each other across the semiconductor topography. Spaced regions between the first pillars are filled with a sacrificial material. A via is formed through a select one of the first pillars inside the perimeter of that select pillar. The via is filled with a conductive material to form a contact extending therethrough to the semiconductor topography. A spaced plurality of coplanar first conductors is then patterned in a plane parallel to the plane formed by the first pillars. The first conductors reside upon the first pillars, upon the select one of the first pillars having the contact, and upon the sacrificial material. The first conductors are then exposed to an anodizing agent. The sacrificial material is then removed to form a multilevel interconnect structure having air gaps between the first pillars and air gaps between the first conductors in regions removed of the sacrificial material.

BRIEF DESCRIPTION OF THE DRAWINGS

Other objects and advantages of the invention will become apparent upon reading the following detailed description and upon reference to the accompanying drawings in which.

Figure 1:
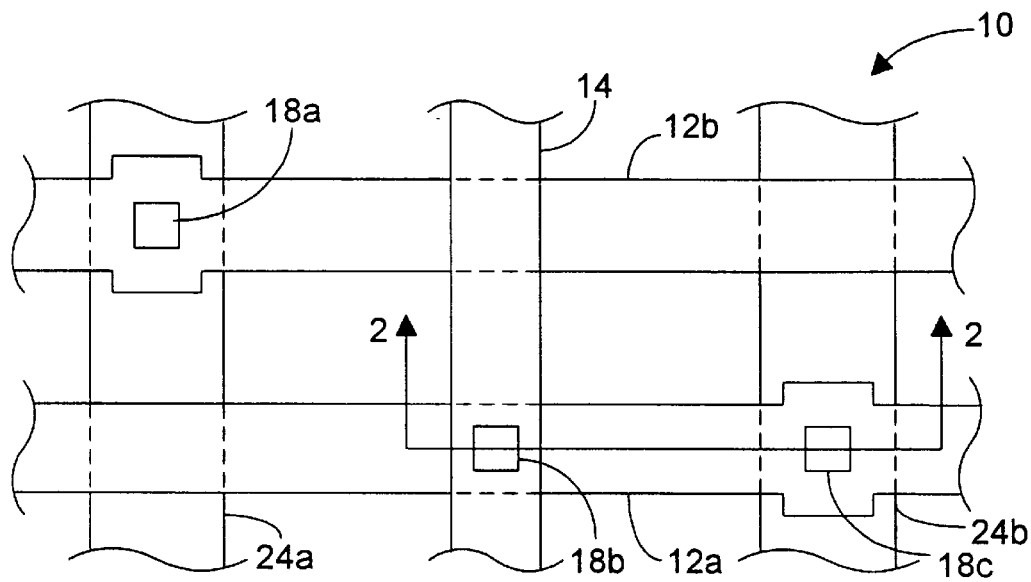
FIG. 1 is a partial, top plan view of a multilevel interconnect structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a partial, top plan view of a multilevel interconnect structure 10. Interconnect structure 10 comprises possibly a plurality of interconnect levels, wherein each level includes a plurality of substantially coplanar conductors. For sake of brevity, interconnect structure 10 shows only a portion of the semiconductor topography and two levels of interconnect: a first level of interconnect 12 and a second level of interconnect 14. Vertically extending contacts 18 are arranged between levels of interconnect, and also serve to connect first level of interconnect 12 to select regions upon a semiconductor topography. In the example provided, only two first level conductors 12a and 12b are shown, and only one second level conductor 14 is shown. It is understood, however, that numerous conductors on each level form a multilevel interconnect structure, and there may be instances where more than two levels of interconnect are needed, depending upon the integrated circuit and its application.

Figure 2:
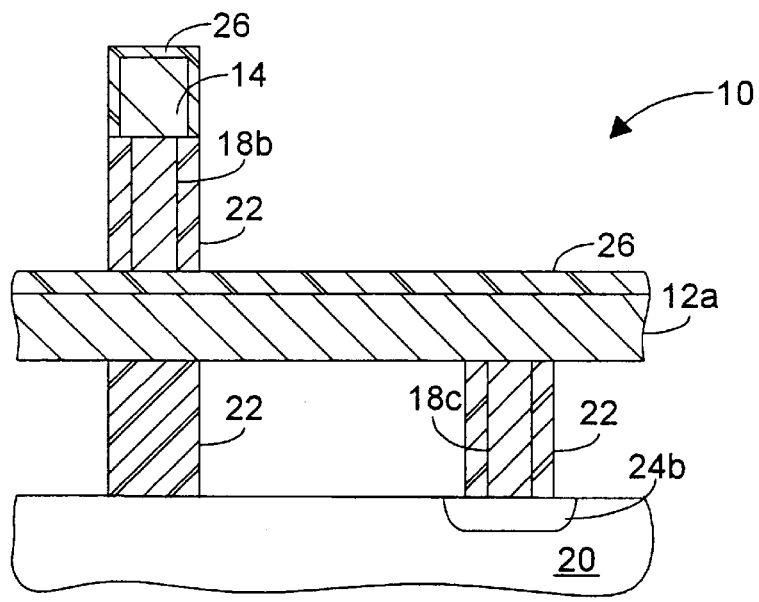
FIG. 2 is a cross-sectional view along plane 2 of FIG. 1.
Figure 3:
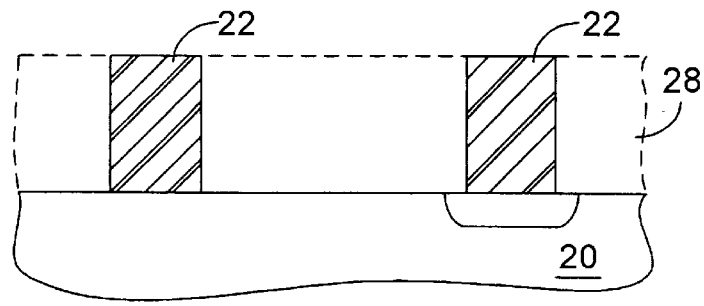
FIG. 3 is a cross-sectional view of a semiconductor topography along plane 2 showing formation of a first layer of pillars across select regions of a semiconductor topography.

In order to more fully understand the elevational disparities between first and second conductors 12 and 14, and the contacts 18 arranged therebetween, a cross-sectional view along plane 2—2 of FIG. 1 is provided in FIG. 2. FIG. 2 more specifically illustrates arrangement of contacts 18 within dielectric pillars 22. Pillars 22 extend between levels of interconnect and serve to support an interconnect above semiconductor topography 20 as well as one interconnect above another. Semiconductor topography 20 includes a dielectric-covered semiconductor substrate or, in the alternative, a dielectric-covered level of interconnect. In the embodiment shown, topography 20 includes a localized region of dopants 24 which, when activated, provide a conductive region which correlates to that shown in FIG. 1. First and second conductors 12a and 14, respectively, are anodized in an oxidizing ambient such that they are significantly more rigid than conductors made primarily of aluminum. The anodizing ambient causes an oxide 26 to form on the upper and sidewalls surfaces of conductors 12a and 14.

Figure 4:
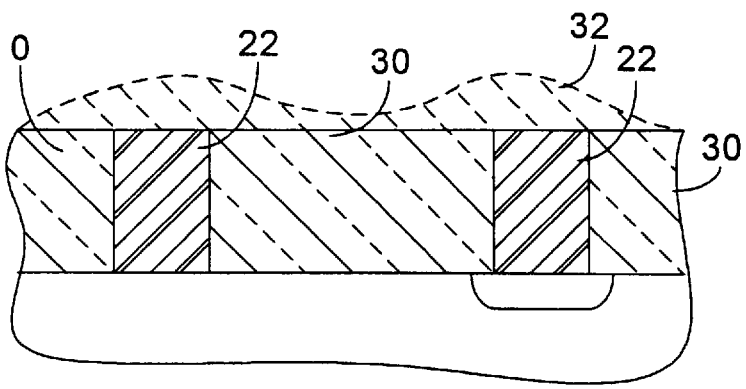
FIG. 4 is a cross-sectional view of a processing step subsequent to that shown in FIG. 3, wherein a sacrificial dielectric is formed between the pillars.

FIGS. 3–12 illustrate a sequence of processing steps used to form multilevel interconnect structure 10. Beginning with FIG. 3, a layer of pillar dielectric material 28 is deposited and thereafter selectively removed to form pillars 22. Pillars 22 are spaced from each other a pre-defined distance across select regions of semiconductor topography 20. FIG. 4 illustrates deposition of a sacrificial dielectric 30 upon and between pillars 22. Sacrificial dielectric 30 is removed from upper elevational regions, as shown by dashed lines 32. The remaining surface of sacrificial dielectric 30 is commensurate with the upper surface of pillars 22. Accordingly, sacrificial dielectric 30 is removed from pillar 22 upper surfaces.

According to one embodiment, pillars 22 are formed from a nitride material, and sacrificial dielectric spacers 30 between pillars 22 are formed from a spin-on glass (SOG). SOG is deposited in liquid form and thereafter minimally cured at a temperature between, e.g., 200° C. and 250° C. for less than thirty minutes. Alternatively, sacrificial dielectric spacer 30 are spin-on deposited from a polyimide source, from a silane source, from a silicate source, or from a silsesquioxane source. Removal of sacrificial dielectric 30 from pillars 22 is suitably performed using a sacrificial etchback technique, wherein the resist material (not shown) and underlying surface 32 are etched at a 1:1 ratio. More preferably, upper surface 32 is removed using chemical-mechanical polish (CMP).

Figure 5:
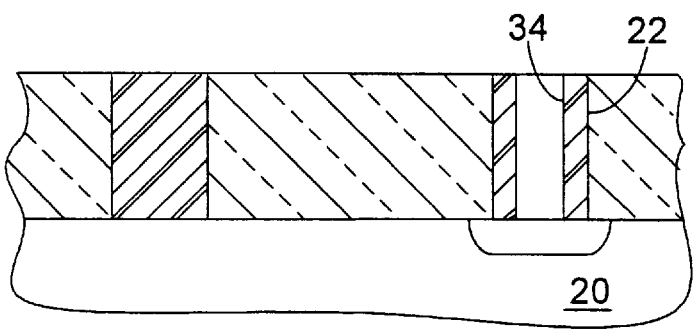
FIG. 5 is a cross-sectional view of a processing step subsequent to that shown in FIG. 4, wherein a via is formed within a select pillar.

FIG. 5 illustrates removal of material from a select pillar 22 to form an opening or via 34 which extends entirely within pillar 22, from the upper surface of pillar 22 to the upper surface of topography 20. The aspect ratio, (or depth-to-width) of via 34 is chosen such that it can be filled using various "plug" techniques.

Figure 6:
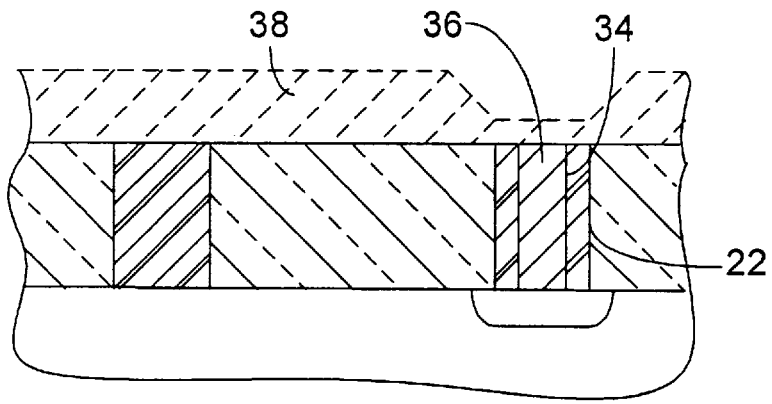
FIG. 6 is a cross-sectional view of a processing step subsequent to that shown in FIG. 5, wherein a contact of conductive material is formed within the via.

FIG. 6 illustrates formation of plug 36 within the via 34. Plug 36 comprises tungsten, or any other suitable conductive material, which is chemical-vapor deposited with a flow rate sufficient to fill via 34 having an aspect ratio less than, for example, 4:1. The plug material 36 is removed from the upper surfaces of dielectric 30 as well as contacts 22 using, for example, sacrificial etchback or CMP. The removed plug material is shown by reference numeral 38.

Figure 7:
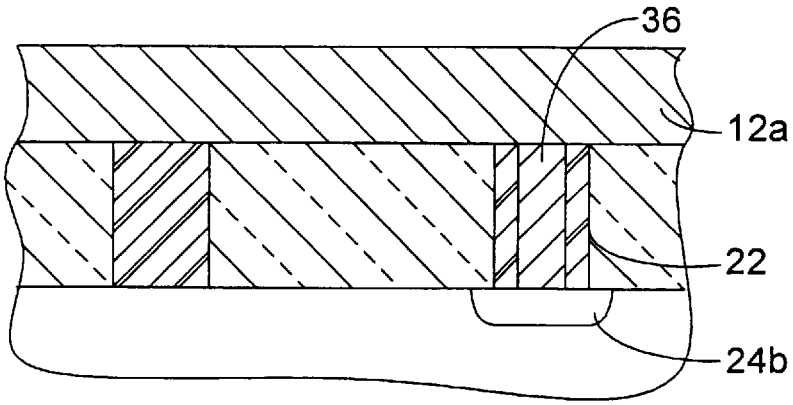
FIG. 7 is a cross-sectional view of a processing step subsequent to that shown in FIG. 6, wherein a first layer of interconnect is formed and thereafter patterned in select regions across the pillars, the sacrificial dielectric and the contact.

FIG. 7 illustrates deposition, and thereafter select removal, of a conductive material necessary to form first conductor 12a. Conductor 12a resides upon pillars 22 as well as contact 36. Contact 36 forms an electrical path between conductor 12a and conductive region 24b.

Figure 8:
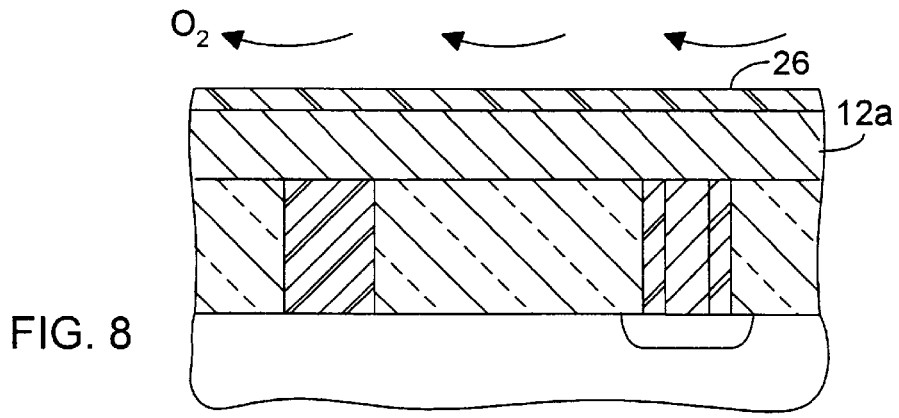
FIG. 8 is a cross-sectional view of a processing step subsequent to that shown in FIG. 7, wherein the exposed upper and sidewall surfaces of conductors within the first layer of interconnect are anodized to form a relatively rigid first layer of interconnect.

Turning now to FIG. 8, an anodizing step is shown, whereby an oxide is deposited upon the upper and sidewall surfaces of each conductor within each level of interconnect. Oxide coating 26 is brought about by an electrodeposit technique. Electrodeposit of oxide on aluminum causes approximately 200 angstroms of $Al_2O_3$ upon the aluminum. Electrodeposit (or anodization) of layer 26 occurs by immersing the aluminum-bearing topography in a solution containing, for example, hydroxide (OH). The solution of hydroxide comprises the anode in an electrolytic cell. According to an alternative embodiment, sulfuric acid is used in lieu of hydroxide. The sulfuric acid causes oxide to form on the aluminum surface which can be later sealed in boiling wager or steam to provide an abrasion-resistant protective coating. According to another alternative embodiment, chromic acid can be used in lieu of hydroxide or sulfuric acid. In either instance, the anode solution is an oxygen-bearing ambient which forms a sufficiently thick oxide on the upper and sidewall surfaces necessary to rigidize the aluminum conductor from its original form. The oxide has a lesser tendency to bend than does pure aluminum or, e.g., an aluminum alloy containing aluminum and tungsten.

Oxide 26 serves not only to rigidize conductor 12a, but also substantially minimizes the corrosion of the underlying aluminum material. Oxide 26 provides a barrier against transport of moisture and acidic contaminants to the aluminum. Sufficient amounts of moisture and acid materials can corrode the aluminum, leading to intermittent opens in the interconnect. Oxide 26 also helps minimizes hillocks on the upper surface of first conductor 12a. Prevention of hillocks lessens the occurrence of hillock growth through the overlying dielectric layer and shorting to the vertically displaced conductors. Still further, oxide 26 helps stabilize the compressive stress inherently found within aluminum films.

Figure 9:
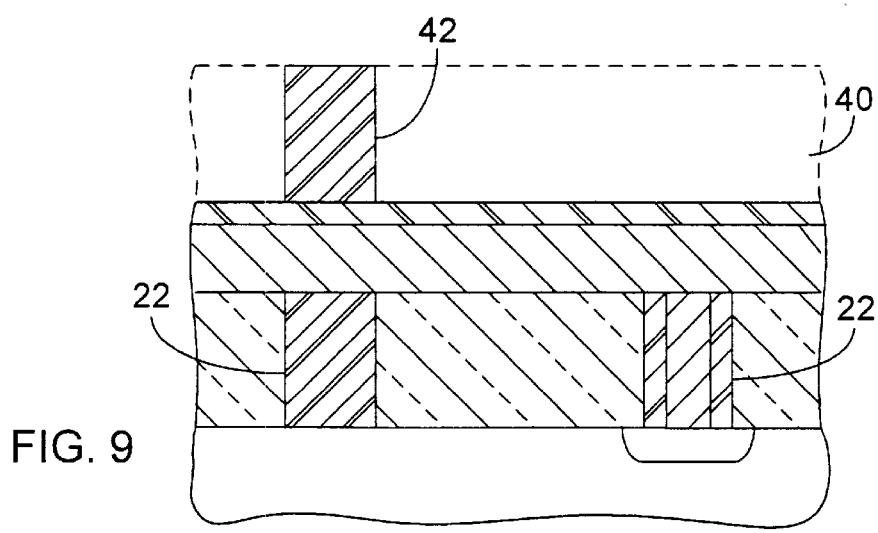
FIG. 9 is a cross-sectional view of a processing step subsequent to that shown in FIG. 8, wherein a second layer of pillars are formed across select regions of the anodized interconnect.

FIG. 9 illustrates deposition of pillar dielectric material 40, and subsequent removal of material 40 to present a second set of pillars 42. Pillars 42 are formed on a second layer, coplanar to each other, and above the layer in which pillars 22 exist. Pillars 42 are formed by the same process used in producing pillars 22, and the processing step shown in FIGS. 4–7 are repeated in order to present FIG. 10.

Figure 10:
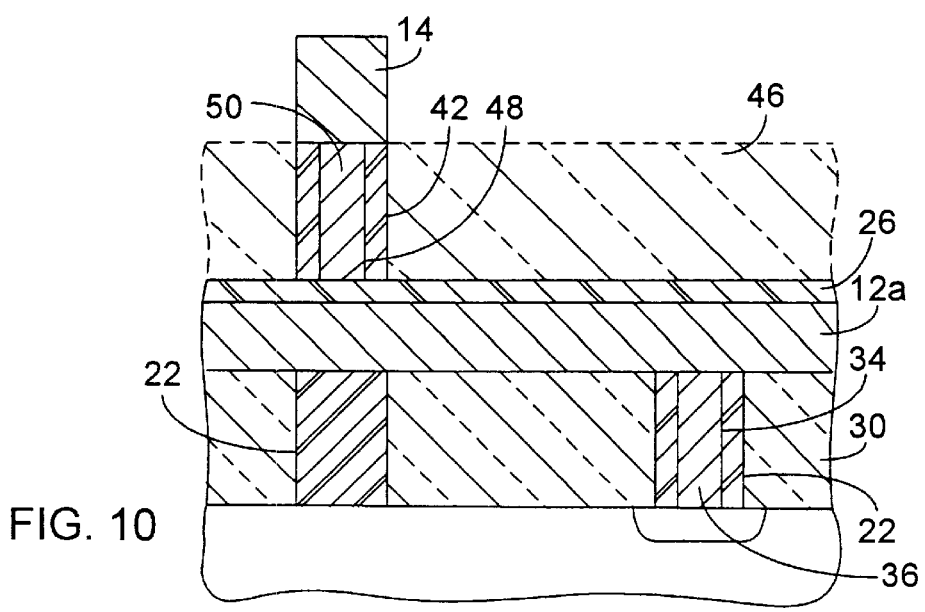
FIG. 10 is a cross-sectional view of a processing step subsequent to that shown in FIG. 9, wherein the steps of FIGS. 4–7 are repeated to present a second layer of interconnect.

FIG. 10 illustrates formation of second conductor 14 from a layer of metal material placed upon sacrificial dielectric 46. Sacrificial material 46 is formed in a fashion similar to sacrificial material 30. Pillar 42 is shown having a via 48 formed therein. Via 48 is subsequently filled with a contact material 50 prior to deposition and patterning of second conductor 14. The process of forming structures 42, 46, 48 and 50 are similar to the process used in producing structures 22, 30, 34 and 36, respectively, but merely repeated on another topographical layer.

Figure 11:
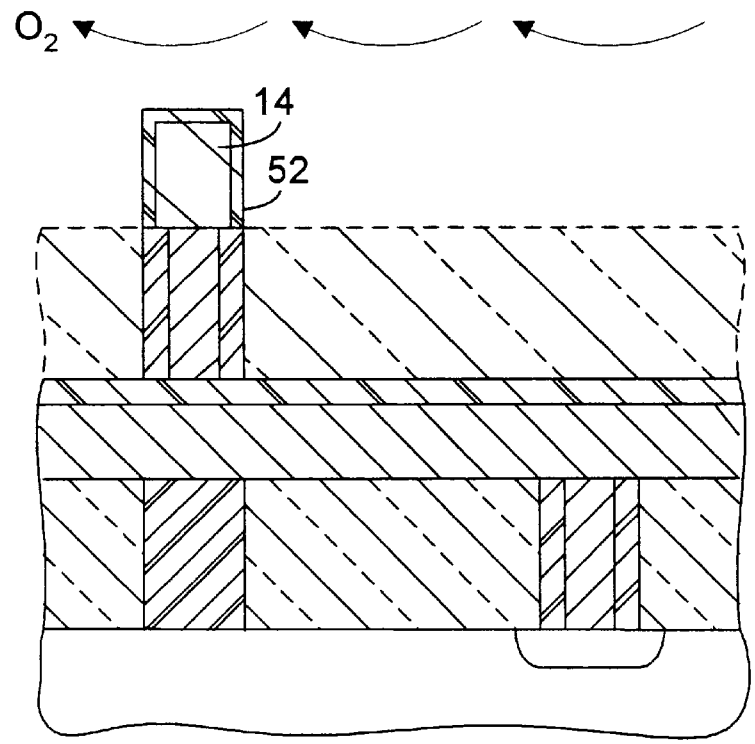
FIG. 11 is a cross-sectional view of a processing step subsequent to that shown in FIG. 10, wherein the exposed upper and sidewall surfaces of conductors within the second layer of interconnect are anodized to form a relatively rigid second layer of interconnect.

FIG. 11 illustrates an anodizing step used to form oxide 52 upon second conductor 14 upper and sidewall surfaces. Anodization of FIG. 11 is identical to that shown in FIG. 8. Accordingly, both the first and second layers of conductors are anodized for the advantages described above.

Figure 12:
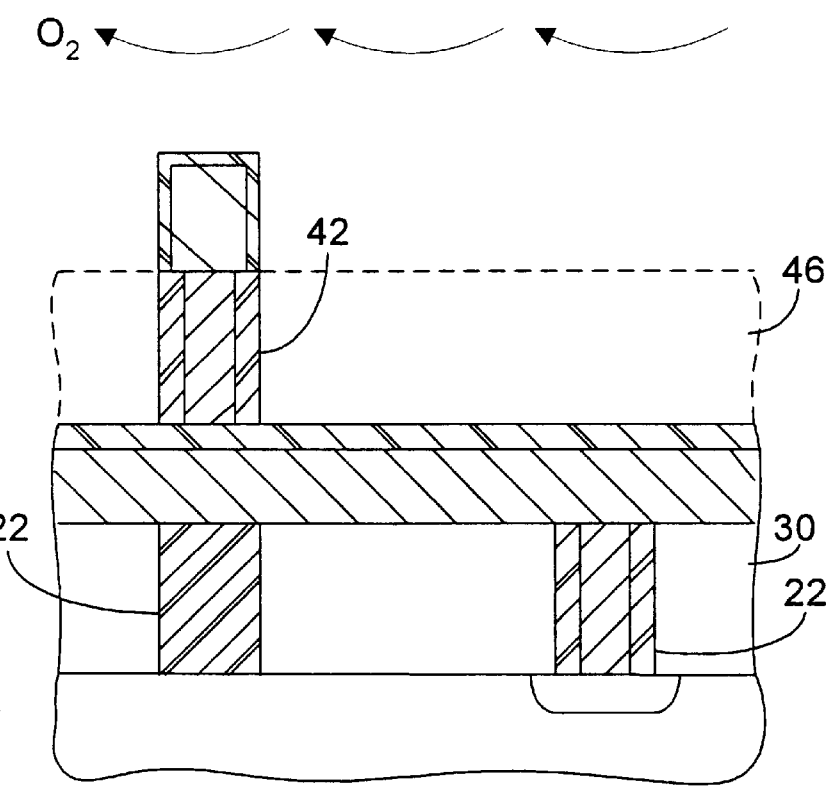
FIG. 12 is a cross-sectional view of a processing step subsequent to that shown in FIG. 11, wherein the layers of sacrificial oxide are removed to form air gaps between pillars on each level which horizontally and vertically separates first and second layers of anodized interconnect.

FIG. 12 illustrates removal of sacrificial dielectrics 30 and 46, leaving only contact-containing or non contact-containing pillars 22 and 42. Pillars 22 and 42 extend a requisite distance across the underlying topography and are spaced a pre-established distance necessary to prevent bending or downward-sagging of, for example, second conductor 14 upon first conductor 12 or first conductor 12 upon semiconductor topography 20. Pillars extend at regular spaced intervals across a level of interconnect. The spacing between pillars is set to a maximum amount dictated by the rigidity of the conductors formed from the present anodization process.

Removal of sacrificial dielectric 30 and 46 occurs by using a wet strip process. The wet strip material, suitably an HF solution, attacks and removes the sacrificial silicon-based material or polyimide, while leaving nitride pillars 22 and 42 intact. The etch solution thereby dissolves sacrificial dielectrics 30 and 46, while retaining all other non-sacrificial dielectric in their original position.

It will be appreciated to those skilled in the art having the benefit of this disclosure that this invention is capable of applications with numerous types of MOS-processed circuits. Furthermore, it is to be understood that the form of the invention shown and described is to be taken as first preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming a multilevel interconnect structure, comprising:

patterning a spaced plurality of coplanar first pillars spaced from each other across a semiconductor topography;

filling the spaced regions between the first pillars with a sacrificial material;

forming a via through a select one of said first pillars inside the outer perimeter of said first pillars;

filling said via with a conductive material to form a contact extending through a select one of said first pillars to said semiconductor topography;

patterning a spaced plurality of coplanar first conductors in a plane parallel to the plane formed by said first pillars, wherein the first conductors reside upon said first pillars, upon the select one of said first pillars having said contact, and upon said sacrificial material;

exposing said first conductors to an anodizing agent; and removing said sacrificial material to form a multilevel interconnect structure having air gaps between said first pillars and air gaps between said first conductors in regions removed of said sacrificial material.

2. The method as recited in claim 1, wherein said filling the spaced region comprises spin on depositing a silicate material.

3. The method as recited in claim 1, wherein said filling the spaced region comprises spin on depositing a silicate material and thereafter heating the silicate material.

4. The method as recited in claim 1, wherein said filling the spaced region comprises spin on depositing a material comprising hydrogen silsesquioxane.

5. The method as recited in claim 1, wherein said filling the spaced region comprises spin on depositing methyl silsesquioxane.

6. The method as recited in claim 1, wherein said forming a via comprises sputter removing a lateral inside portion of the select one of said first pillars.

7. The method as recited in claim 1, wherein said filling said via comprises chemical vapor depositing a tungsten material.

8. The method as recited in claim 1, wherein said patterning said first conductors comprises sputter depositing a layer of aluminum and thereafter selectively removing portions of the aluminum layer.

9. The method as recited in claim 1, wherein said exposing said first conductor comprises subjecting said first conductor to a hydroxide solution.

10. The method as recited in claim 1, wherein said exposing said first conductor comprises subjecting the upper surface and opposed sidewall surfaces of an aluminum first conductor to an oxygen-bearing solution for forming approximately 200 angstroms of aluminum oxide on the upper and opposed sidewall surfaces.

11. The method as recited in claim 1, wherein said removing comprises exposing said sacrificial material in regions between said first conductors to hydrogen fluoride solution which removes substantially all of said sacrificial material.

\* \* \* \* \*